US012288693B2

(12) United States Patent
Oshio et al.

(10) Patent No.: US 12,288,693 B2
(45) Date of Patent: Apr. 29, 2025

(54) ETCHING SOLUTION, METHOD FOR TREATING SUBSTRATE WITH THE ETCHING SOLUTION, AND METHOD FOR MANUFACTURING SEMICONDUCTOR DEVICE

(71) Applicant: TOKUYAMA CORPORATION, Yamaguchi (JP)

(72) Inventors: Manami Oshio, Yamaguchi (JP); Naoto Nomura, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 0 days.

(21) Appl. No.: 18/277,177

(22) PCT Filed: Mar. 1, 2023

(86) PCT No.: PCT/JP2023/007478
§ 371 (c)(1),
(2) Date: Aug. 14, 2023

(87) PCT Pub. No.: WO2023/167220
PCT Pub. Date: Sep. 7, 2023

(65) Prior Publication Data
US 2024/0034933 A1    Feb. 1, 2024

(30) Foreign Application Priority Data
Mar. 4, 2022  (JP) .................... 2022-033292

(51) Int. Cl.
*H01L 21/3213*   (2006.01)
*C09K 13/00*     (2006.01)
*C09K 13/04*     (2006.01)
*H01L 21/311*    (2006.01)

(52) U.S. Cl.
CPC ........ *H01L 21/32134* (2013.01); *C09K 13/00* (2013.01); *C09K 13/04* (2013.01); *H01L 21/31105* (2013.01); *H01L 21/31111* (2013.01)

(58) Field of Classification Search
None
See application file for complete search history.

(56) References Cited

U.S. PATENT DOCUMENTS

| 9,780,000 | B2 * | 10/2017 | Posseme ......... H01L 21/823864 |
| 2007/0082497 | A1 | 4/2007 | Lee et al. |
| 2007/0298611 | A1 * | 12/2007 | Bian ................ H01L 21/31053 438/693 |
| 2008/0087644 | A1 | 4/2008 | Nishioka et al. |
| 2015/0008503 | A1 * | 1/2015 | Makala .................. H10B 43/35 257/324 |
| 2017/0062231 | A1 * | 3/2017 | Sato ................. H01L 21/30608 |
| 2023/0287304 | A1 * | 9/2023 | Takahashi ......... H01L 21/02244 |

FOREIGN PATENT DOCUMENTS

| JP | 2006-229215 A | 8/2006 | |
| JP | 2007-49145 A | 2/2007 | |
| JP | 2022-18498 A | 1/2022 | |
| JP | 2022018498 | * 1/2022 | ........... H01L 21/306 |
| WO | WO2022044893 | * 3/2022 | ............. C11D 17/08 |

OTHER PUBLICATIONS

ISR for PCT/JP2023/007478, dated May 9, 2023.
Written Opinion of the ISA for PCT/JP2023/007478, dated May 9, 2023 (w/ translation).
Inoue et al., "Influence of Composition of SiCN as Interfacial Layer on Plasma Activated Direct Bonding", ECS Journal of Solid State Science and Technology, 2019, 8(6):346-350.

* cited by examiner

*Primary Examiner* — Jiong-Ping Lu
(74) *Attorney, Agent, or Firm* — GREENBLUM & BERNSTEIN, P.L.C.

(57) ABSTRACT

Silicon carbonitride with excellent dielectric and/or other properties may be used in manufacturing semiconductor devices. The manufacturing often requires etching silicon carbonitride without etching silicon oxide, but there is no known etching solution that sufficiently selectively etches silicon carbonitride containing carbon compared with silicon nitride used for the same purpose. An object of the present invention is to provide: an etching solution with a high etching selectivity ratio of silicon carbonitride to silicon oxide; a method of treating a substrate, the method including a step of bringing the etching solution into contact with the substrate; and a method of manufacturing a semiconductor device, the method including the method of treating a substrate. The object is achieved by an etching solution for etching silicon carbonitride, the etching solution composed of a homogeneous solution containing phosphoric acid, water, and a cerium ion.

7 Claims, No Drawings

ETCHING SOLUTION, METHOD FOR TREATING SUBSTRATE WITH THE ETCHING SOLUTION, AND METHOD FOR MANUFACTURING SEMICONDUCTOR DEVICE

TECHNICAL FIELD

The present invention relates to an etching solution for etching silicon carbonitride. The present invention also relates to a method of treating a substrate using the etching solution. The present invention also relates to a method of manufacturing a semiconductor device using the etching solution. The substrate includes a semiconductor wafer, a silicon substrate, or the like.

BACKGROUND ART

Various materials are used in manufacturing processes of semiconductor devices. Among those materials, silicon nitride and silicon carbonitride are known to be useful in various fields, such as a copper diffusion barrier film, a passivation film, an etch stop film, a surface protective film, and a gas barrier film. For example, a silicon nitride film (SiN film, silicon nitride film) and/or a silicon carbonitride film (SiCN film, silicon carbonitride film) is formed on a substrate, such as a silicon wafer or a processed body of a silicon wafer, and used. Here, the silicon carbonitride also includes compounds containing hydrogen and/or oxygen in addition to compounds having a skeleton of silicon, carbon, and nitrogen, for example, as shown in Non-Patent Document 1.

In the pattern formation of a semiconductor, a step of selectively etching a silicon nitride film and/or a silicon carbonitride film formed on a substrate while leaving a silicon oxide film may be required (hereinafter "selectively" means being selective compared with silicon oxide unless otherwise stated).

A phosphoric acid aqueous solution is commonly used for etching silicon nitride. However, unlike silicon nitride, silicon carbonitride is hardly etched with a phosphoric acid aqueous solution.

In a method of etching a silicon carbonitride film that has been introduced, a composition containing an oxidizing agent, a fluorine compound, and water is used (Patent Document 1); however, the etching rate of silicon carbonitride described in Examples is less than 250 Å/30 min, not providing a sufficient rate. In addition, such a composition also etches a silicon oxide film ($SiO_2$ film, silicon oxide film).

PRIOR ART DOCUMENTS

Patent Document

Patent Document 1: JP 2007-049145 A

Non-Patent Document

Non-Patent Document 1: ECS Journal of Solid State Science and Technology, 8 (6) P346-P350 (2019)

SUMMARY OF INVENTION

Technical Problem

In the manufacturing of semiconductor devices, the use of a silicon carbonitride film provides even better performance, but as described above, there has been no etching solution that can sufficiently selectively etch silicon carbonitride compared with silicon oxide, and its use has been extremely limited. Thus, an object of the present invention is to provide: an etching solution with a high etching selectivity ratio of silicon carbonitride to silicon oxide; a method of treating a substrate, the method including a step of bringing the etching solution into contact with the substrate; and a method of manufacturing a semiconductor device, the method including the method of treating a substrate.

Solution to Problem

In view of the above problems, the present inventors have diligently studied a composition that can selectively etch silicon carbonitride. As a result, the present inventors have found that further addition of cerium ions to a phosphoric acid aqueous solution, which has been used for selective etching of silicon nitride in the prior art, can greatly improve the etching rate of silicon carbonitride with little change in the etching rate of silicon oxide, and completed the present invention.

That is, the gist of the present invention is the following.

[1] An etching solution for etching silicon carbonitride, the etching solution composed of a homogeneous solution containing phosphoric acid, water, and a cerium ion.

[2] The etching solution according to [1], wherein a content of a cerium ion contained in the etching solution is 0.001 mol/L or greater and 0.2 mol/L or less.

[3] The etching solution according to [1] or [2], further containing sulfuric acid.

[4] The etching solution according to any of [1] to [3], wherein the etching solution is an etching solution for use in manufacturing a semiconductor device.

[5] An etching solution for etching silicon carbonitride, the etching solution composed of a solution containing phosphoric acid, water, and a cerium compound excluding cerium dioxide.

[6] A method of treating a substrate, the method including a step of bringing the etching solution according to any of [1] to [5] into contact with a substrate having a silicon oxide film and a silicon carbonitride film.

[7] A method of manufacturing a semiconductor device, the method including the method of treating a substrate according to [6].

Effects of Invention

According to the present invention, silicon carbonitride can be selectively etched using a homogeneous solution containing phosphoric acid, water, and a cerium ion as an etching solution.

Furthermore, the etching solution of the present invention can etch silicon nitride almost equivalently to a phosphoric acid aqueous solution used in the prior art. Thus, this enables both steps of selectively etching silicon carbonitride and selectively etching silicon nitride to be dealt with the same etching solution, and this in turn can reduce the time and work otherwise required for managing each of plural types of etching solutions as necessary, as well.

DESCRIPTION OF EMBODIMENTS (Etching Solution)

An etching solution according to an embodiment of the present invention includes a homogeneous solution containing phosphoric acid, water, and a cerium ion and is used for etching silicon carbonitride.

The content of phosphoric acid in the etching solution according to the present embodiment is in the same range as that of an etching solution for silicon nitride known in the art and specifically is preferably 50 mass % or greater and 98 mass % or less and particularly preferably 70 mass % or greater and 94 mass % or less. Etching silicon carbonitride at high temperatures provides a high etching rate and is advantageous, and the etching solution with a higher proportion of phosphoric acid can be used stably at higher temperatures. On the other hand, water and a cerium ion are essential for the etching solution according to the present embodiment, and thus containing phosphoric acid in an amount of more than 98 mass % is not practical. In the present specification, when the blending amount of each component is described in mass %, the numerical value is a proportion to the entire etching solution regarded as 100 mass %.

Although in a concentrated solution of phosphoric acid like the etching solution according to the present embodiment, phosphoric acid is in an equilibrium state between orthophosphoric acid ($H_3PO_4$) and polyphosphoric acid in the solution, the above content is an amount on the assumption that the entire amount is present as orthophosphoric acid. The same applies to the case where phosphoric acid is present as pyrophosphoric acid or the like.

The etching solution according to the present embodiment contains water as an essential component. In the absence of water, the reaction of etching silicon carbonitride would not proceed, but too much water would tend to make it difficult to use the etching solution at high temperatures. The content of water is preferably 1 mass % or greater and 49 mass % or less and more preferably 5 mass % or greater and 29 mass % or less although this depends on the types and amounts of other components. Again, the amount of water in this case is also an amount on the assumption that the phosphoric acid is present entirely as orthophosphoric acid.

The etching solution according to the present embodiment contains a cerium ion as an essential component. The presence of a cerium ion in the etching solution greatly increases the etching rate of silicon carbonitride.

Silicon carbonitride is hardly etched with a phosphoric acid aqueous solution containing no cerium ion, and this is considered to be due to the difference in polarity between the Si—C bond and the Si—N bond. The difference in electronegativity between a C atom and a Si atom is smaller than that between a N atom and a Si atom. Thus, the polarization of the Si—C bond is smaller than that of the Si—N bond, and thus it is conceivable that an electrophilic addition reaction with an acid is less likely to occur and the etching of silicon carbonitride hardly proceeds. On the other hand, in the etching solution containing a cerium ion in addition to the phosphoric acid aqueous solution, the cerium ion is considered to act on the Si—C bond and allow the etching of silicon carbonitride to proceed.

The cerium ion can be present as a monoatomic ion in the etching solution or can be present as a constituent atom of a complex ion (polyatomic ion). In addition, the valence of the cerium ion is not limited but the cerium ion is preferably trivalent or tetravalent. Furthermore, cerium ions with different valences can coexist.

In the etching solution according to the present embodiment, the content of a cerium ion is preferably 0.001 mol/L or greater and 0.2 mol/L or less and particularly preferably 0.002 mol/L or greater and 0.1 mol/L or less. The etching solution with a higher cerium ion content has a higher promoting effect on etching silicon carbonitride. On the other hand, with too high a cerium ion content, a large amount of residue would tend to deposit on the substrate surface after etching, and the residue would not be removed even if a rinse treatment described later is performed after etching.

The etching solution according to the present embodiment can contain a counter ion derived from a compound (described later) used as a cerium ion source. Examples of the counter ion include inorganic ions, such as a fluoride ion, a chloride ion, a bromide ion, a sulfate ion, a nitrate ion, a carbonate ion, and a hydroxide ion; and organic ions, such as an acetate ion and an oxalate ion. In addition, in the case where the cerium compound used is a double salt, an ion, such as an ammonium ion, derived from the double salt can be contained.

The etching solution according to the present embodiment preferably further contains sulfuric acid (including the case where sulfuric acid is present as a sulfate ion). The presence of sulfuric acid enables the etching solution to reduce the etching rate of silicon oxide without impairing the etching rate of silicon carbonitride and to provide high selectivity. The concentration of sulfuric acid is preferably 0.1 mass % or greater and 20 mass % or less, more preferably 0.2 mass % or greater and 5 mass % or less, and even more preferably 0.5 mass % or greater and 2.0 mass % or less.

The etching solution according to the present embodiment can further contain a known component that is contained in an etching solution containing phosphoric acid as a main component as long as the etching solution is maintained as a homogeneous solution.

Examples of such a known component include the following additives that reduce the etching rate of silicon oxide and additives that prevent the deposition of silicic acid.

Known examples of additives that reduce the etching rate of silicon oxide include soluble silicon compounds and acids other than phosphoric acid. Examples of the soluble silicon compound include silicic acid, silicate salts, hexafluorosilicic acid, hexafluorosilicate salts, alkoxysilanes, such as tetraethoxysilane and tetramethoxysilane; and alkylsilanes, such as methyltrimethoxysilane and the like. Examples of the acid other than phosphoric acid include sulfuric acid, nitric acid, hydrochloric acid, and oxalic acid.

Furthermore, known examples of additives that prevent the deposition of silicic acid include organic quaternary ammonium salts and organic quaternary phosphonium salts. In addition, there is also a method of adding an organic alkali silicate containing an organic alkali that inhibits the deposition of silicic acid.

That is, the etching solution according to the present embodiment can contain an ion and/or the like generated in the solution by adding these compounds.

The etching solution according to the present embodiment is a homogeneous solution. Here, the homogeneous solution is a solution that is not phase-separated into an aqueous phase and an organic phase at 25° C. and in which no visually observable solid matter is dispersed. Whether the etching solution is a homogeneous solution can be visually observed but is preferably determined by irradiating the etching solution with a general laser pointer (e.g., TLP-3200 available from Toshin Co., Ltd., maximum power: less than 1 mw, wave length: from 650 to 660 nm) and checking that the optical path is not observed. When the etching solution is irradiated with the laser pointer and the optical path is observed, the etching solution is a heterogeneous solution. When a heterogeneous solution is used as an etching solution, an undissolved component may cause contamination of a wafer, a device, and/or the like, and/or may cause heterogeneous etching. Thus, a heterogeneous solution is not preferably used as an etching solution.

(Impurity in Etching Solution)

The etching solution according to the present embodiment can contain a particle and/or a trace amount of metal as an impurity to the extent that the state as the homogeneous solution described above can be maintained.

In terms of preventing contamination during etching, the number of particles with a size of 200 nm or greater is preferably 100/mL or less, more preferably 50/mL or less, and even more preferably 10/mL or less. It is particularly preferred that all particles pass through a filter with no particles failing to pass through when the etching solution is applied to a filter with an opening of 50 nm, and it is most preferred that all particles pass through a filter with an opening of 10 nm.

From the viewpoint of preventing contamination of an etching target, the concentration of a metal impurity is preferably as low as possible as well. The metal impurity mentioned here refers to a metal other than cerium, and specifically, the concentrations of Ag, Al, Ba, Ca, Cd, Cr, Cu, Fe, K, Li, Mg, Mn, Na, Ni, Pb, Zn, and Pr are all preferably 1 ppm or less.

(Manufacturing Method)

A method of manufacturing the etching solution according to the present embodiment is not particularly limited, and for example, phosphoric acid, water, and the cerium compound described above are mixed to a predetermined concentration to produce a homogeneous solution.

For the phosphoric acid, a product with the lowest possible concentrations of a metal impurity and/or an insoluble impurity as described above is preferably used; a commercially available product can be purified as necessary for use by recrystallization, column purification, ion exchange purification, distillation, sublimation, filtration treatment, or the like. In addition, for the phosphoric acid, a high-purity product manufactured and sold for semiconductor manufacturing is preferably used.

The water also preferably has a high purity with few impurities. An amount of impurities can be evaluated by electrical resistivity. Specifically, the water preferably has an electrical resistivity of 0.1 MΩ·cm or greater, more preferably 15 MΩ·cm or greater, and particularly preferably 18 MΩ·cm or greater. Such water with a small amount of impurities can be easily produced and/or procured as ultrapure water for semiconductor production. Furthermore, ultrapure water is highly suitable because it contains remarkably little impurities that do not affect (or contribute little to) the electrical resistivity.

A cerium compound that can be used as a cerium ion source is a cerium compound with such solubility as to make the etching solution prepared by adding a desired amount of the cerium compound homogeneous. For example, one or more of cerium hydroxide, cerium salts, and double salts containing cerium and a cation other than cerium (e.g., an ammonium ion) can be used.

Furthermore, from the viewpoint of good solubility and ease of producing a high purity product, cerium nitrate, cerium sulfate, cerium ammonium nitrate, cerium ammonium sulfate, or the like is preferably used as the cerium compound. These can be hydrates.

On the other hand, when a cerium compound, such as cerium dioxide, with extremely low solubility in an aqueous solution containing phosphoric acid is used, the cerium compound does not dissolve in a solution containing phosphoric acid and water, and thus a homogeneous solution is not formed, and solid matter is formed. An insoluble component in the solution becomes a particle source, and thus this may cause heterogeneous etching and/or cause a defect in the next step. That is, the cerium ion source used in producing the etching solution according to the present embodiment is preferably a cerium compound excluding cerium dioxide. In addition, cerium compounds like cerium acetate, cerium phosphate, and cerium carbonate also have low solubility in an aqueous solution containing phosphoric acid. Thus, the cerium ion source is more preferably a cerium compound excluding cerium acetate, cerium phosphate, cerium carbonate, and cerium dioxide.

For the cerium compound, a product with the highest possible purity is preferably used; a commercially available product can be purified as necessary for use by recrystallization, column purification, ion exchange purification, filtration treatment, or the like.

In the production of the etching solution according to the present embodiment, after mixing and dissolving the components, the resulting solution is preferably passed through a filter with openings of several nanometers to several tens of nanometers to remove particles. The process of passing the resulting solution through a filter can be performed multiple times as necessary. In addition to that, a treatment of various types known as a method of manufacturing a chemical solution for manufacturing a semiconductor can be applied.

Application and Method of Use

The etching solution according to the present embodiment can be used in an etching treatment of a substrate containing silicon carbonitride in manufacturing a semiconductor device. The method of forming a silicon carbonitride film on the substrate is not limited, and a silicon carbonitride film formed by a known method, such as a CVD method or a PVD method, can be etched. In addition, the silicon carbonitride film used in manufacturing a semiconductor device may contain hydrogen in an amount of 133 atomic % at the maximum relative to silicon depending on its manufacturing method. Such a film containing hydrogen also corresponds to silicon carbonitride to be etched using the etching solution according to the present embodiment. Furthermore, the silicon carbonitride to be etched can contain an impurity element of various types (e.g., oxygen) to the extent that it is usually contained.

Moreover, the etching solution according to the present embodiment can be used for treatment of a substrate having a silicon oxide film and a silicon carbonitride film. Using the etching solution according to the present embodiment enables selective etching of silicon carbonitride while preventing etching of silicon oxide. Such selective etching has been substantially impossible with an etching solution in the prior art.

Hereinafter, the method of treating the silicon carbonitride film will be described more specifically.

The method of treating a substrate using the etching solution according to the present embodiment includes a step of bringing the etching solution according to the present embodiment into contact with a substrate having a silicon oxide film and a silicon carbonitride film. Preferably, the method includes a step of supplying a treatment liquid, in which a substrate is held in a horizontal posture, and the etching solution according to the present embodiment is supplied to a main surface of the substrate while the substrate is rotated about a vertical rotation axis passing through a central portion of the substrate.

In another preferred aspect, the method of treating a substrate using the etching solution according to the present embodiment includes a step of holding a plurality of substrates in an upright posture and immersing the substrates in an upright position in the etching solution according to the present embodiment stored in a treatment vessel. In a preferred embodiment of the present invention, the etching solution is used in the manufacture of a semiconductor device including the treating method described above.

The temperature of the silicon etching solution during etching using the etching solution according to the present embodiment is appropriately determined from a range of 100 to 200° C. in view of a desired etching rate, surface conditions after etching, productivity, and the like but is suitably in a range of 130 to 180° C. At temperatures above 200° C., damage may occur to semiconductor materials other than silicon carbonitride, and at temperatures below 100° C., it is difficult to etch silicon carbonitride at an industrially satisfactory rate.

During etching using the etching solution according to the present embodiment, ultrasonic waves or the like can be used to promote etching.

When a residual impurity remains on the surface of the substrate after the substrate treatment using the etching solution according to the present embodiment, a known treatment of various types can be applied to remove the impurity. For example, there is a method in which a rinse treatment is performed on a substrate using a rinse solution. For the rinse solution, a known rinse solution can be used, and examples include acidic aqueous solutions, such as hydrochloric acid, hydrofluoric acid, and sulfuric acid; alkaline aqueous solutions, such as ammonia water; a mixed solution of hydrofluoric acid and hydrogen peroxide solution (FPM); a mixed solution of sulfuric acid and hydrogen peroxide solution (SPM); a mixed solution of ammonia water and hydrogen peroxide solution (APM); and a mixed solution of hydrochloric acid and hydrogen peroxide solution (HPM). These can be used individually, or a plurality of these can be used in combination.

In the substrate treating method using the etching solution according to the present embodiment, the etching solution can be collected after treating wafer and can be used for treating another wafer after performing a regeneration process, such as filter filtration and concentration adjustment of components of the etching solution. The concentration adjustment of components can be performed through a mechanism for additionally adding fresh phosphoric acid and/or water while monitoring the concentrations of phosphoric acid and water. In addition, water and/or low-concentration phosphoric acid diluted with water can be used to prepare water.

EXAMPLES

Hereinafter, the present invention will be described in further detail by examples, but the present invention is not limited to these examples.

Example 1

(Method of Preparing Etching Solution)

Phosphoric acid, water, and cerium ammonium nitrate as a cerium compound were placed in a flask in proportions described in Table 1. The flask was immersed in an oil bath set at a predetermined liquid temperature and heated for 30 minutes with stirring the liquid at 600 rpm.

(Method of Evaluating Homogeneity of Etching Solution)

When the etching solution was stirred at 25° C. for 30 minutes and then the inside was observed, no solid matter was observed. Furthermore, when the etching solution was irradiated with a laser pointer (TLP-3200 available from Toshin Co., Ltd., maximum power: less than 1 mw, wave length: from 650 to 660 nm) at 25° C., no optical path was observed, thus the components were determined to be completely dissolved to form a homogeneous solution. The results are shown in Table 2. In the table, examples which result in a homogeneous solution are indicated by ○.

(Method of Evaluating Etching Rate)

A silicon wafer (silicon carbonitride film) with a size of 2×1 cm produced by forming a film of silicon carbonitride was prepared, and the initial film thickness was measured with a spectroscopic ellipsometer. The silicon carbonitride film was immersed for 5 minutes in 200 g of the etching solution heated to a solution temperature of 166° C. The wafer was washed by a rinse treatment and dried, and then the film thickness was measured with a spectroscopic ellipsometer. The etching rate (RSiCN) was determined by determining the etching amount of silicon carbonitride from the film thickness difference between the initial and post-process and dividing the etching amount by the etching time. The results are shown in Table 2.

Also for a silicon wafer (silicon nitride film) with a size of 2×1 cm produced by forming a film of silicon nitride and a silicon wafer (silicon oxide film) with a size of 2×1 cm produced by forming a film of silicon oxide, the etching rates (RSiN, RSiO$_2$) were calculated in the same manner as for the silicon carbonitride film except that the silicon nitride film was immersed for 2 minutes and the silicon oxide film was immersed for 10 minutes. The results are shown in Table 2.

From these measurement results, the etching selectivity ratio (RSiCN/RSiO$_2$) of the silicon carbonitride film to the silicon oxide film and the etching selectivity ratio (RSiN/RSiO$_2$) of the silicon nitride film to the silicon oxide film were determined. The results are shown in Table 2.

Examples 2 to 13 and Comparative Example 1

Etching rates were each evaluated in the same manner as in Example 1 except that the etching solution with the composition shown in Table 1 was used as the etching solution and etched at the temperature shown in Table 1, the immersion time was changed, and thus the absolute amount of etching was adjusted to be equivalent to that in Example 1. The results are shown in Table 2.

TABLE 1

| | Etching Solution (the balance is phosphoric acid) | | | | | |
|---|---|---|---|---|---|---|
| | Cerium compound | | | Sulfuric acid Content (mass %) | Water Content (mass %) | Temperature (° C.) |
| | Type | Cerium compound content (mass %) | Cerium content (mmol/L) | | | |
| Example 1 | Cerium (IV) ammonium nitrate | 0.10 | 2 | — | 15 | 166 |
| Example 2 | Cerium (IV) ammonium nitrate | 1.0 | 18 | — | 15 | 165 |
| Example 3 | Cerium (IV) ammonium nitrate | 3.0 | 55 | — | 15 | 160 |
| Example 4 | Cerium (IV) ammonium nitrate | 1.0 | 18 | — | 11 | 135 |
| Example 5 | Cerium (IV) ammonium nitrate | 1.0 | 18 | — | 11 | 145 |
| Example 6 | Cerium (IV) ammonium nitrate | 1.0 | 18 | — | 11 | 165 |
| Example 7 | Cerium (IV) ammonium nitrate | 1.0 | 18 | — | 11 | 190 |
| Example 8 | Cerium (III) nitrate | 0.59 | 18 | — | 15 | 165 |
| Example 9 | Cerium (IV) ammonium sulfate | 1.1 | 18 | — | 15 | 165 |
| Example 10 | Cerium (IV) sulfate | 0.61 | 18 | — | 15 | 165 |
| Example 11 | Cerium (IV) ammonium nitrate | 1.0 | 18 | 0.5 | 15 | 165 |
| Example 12 | Cerium (IV) ammonium nitrate | 1.0 | 18 | 1 | 15 | 165 |
| Example 13 | Cerium (IV) ammonium nitrate | 1.0 | 18 | 5 | 15 | 165 |
| Comparative Example 1 | — | — | — | — | 15 | 165 |

TABLE 2

| | SiCN etching rate (nm/min) | SiN etching rate (nm/min) | SiO$_2$ etching rate (nm/min) | Selectivity ratio | | Homogeneity of etching solution |
|---|---|---|---|---|---|---|
| | | | | SiCN/SiO$_2$ | SiN/SiO$_2$ | |
| Example 1 | 1.22 | 8.12 | 0.16 | 7.6 | 50.8 | ○ |
| Example 2 | 2.06 | 6.94 | 0.15 | 13.7 | 46.3 | ○ |
| Example 3 | 2.19 | 6.84 | 0.19 | 11.5 | 36.0 | ○ |
| Example 4 | 0.32 | — | 0.06 | 5.3 | — | ○ |
| Example 5 | 0.69 | — | 0.09 | 7.7 | — | ○ |
| Example 6 | 1.89 | — | 0.17 | 11.1 | — | ○ |
| Example 7 | 5.78 | 16.0 | 0.74 | 7.8 | 21.6 | ○ |
| Example 8 | 2.12 | 6.98 | 0.15 | 14.1 | 46.5 | ○ |
| Example 9 | 2.09 | 6.95 | 0.13 | 16.1 | 53.5 | ○ |
| Example 10 | 2.15 | 7.01 | 0.16 | 13.4 | 43.8 | ○ |
| Example 11 | 2.23 | 6.99 | 0.12 | 18.6 | 58.3 | ○ |
| Example 12 | 2.10 | 6.97 | 0.09 | 23.3 | 77.4 | ○ |
| Example 13 | 2.18 | 6.98 | 0.08 | 27.3 | 87.3 | ○ |
| Comparative Example 1 | 0.31 | 8.61 | 0.16 | 1.9 | 53.8 | ○ |

In Examples 1 to 10, in which a cerium compound, which dissolves in a solution containing phosphoric acid and water, was used, the etching rate of silicon carbonitride was greatly improved compared with the etching solution containing no cerium ion (Comparative Example 1). On the other hand, the etching rate of silicon oxide hardly changes, and the etching rate of silicon nitride is also good. From this, it can be said that the etching solution according to an embodiment of the present invention has an excellent etching rate of silicon carbonitride and has high selectivity of silicon carbonitride compared with silicon oxide.

In Examples 11 to 13, in which the etching solution further containing sulfuric acid was used, the etching rate of silicon oxide was reduced compared with Example 2, in which the composition of the components other than sulfuric acid was the same, and this resulted in further improvement of the selectivity.

Comparative Examples 2 and 3

Cerium dioxide (cerium (IV) oxide) was used as a cerium compound and mixed with phosphoric acid. The resulting mixture contained cerium in an amount of 2 mmol/L (Comparative Example 2; 0.03 mass % in terms of cerium dioxide) or 18 mmol/L (Comparative Example 3; 0.3 mass % in terms of cerium dioxide) and water in an amount of 15 mass %. However, solid matter was observed in the liquid, an optical path was found by irradiation with a laser pointer, and a homogeneous solution was not produced. Thus, the solutions according to Comparative Examples 2 and 3 were unsuitable as etching solutions.

The invention claimed is:

1. A method of treating a substrate, the method comprising a step of bringing an etching solution into contact with a substrate comprising a silicon oxide film and a silicon carbonitride film, wherein the etching solution is composed of a homogeneous solution comprising phosphoric acid, water, and a cerium ion, wherein a content of a tetravalent cerium ion contained in the etching solution is 0.001 mol/L or greater and 0.2 mol/L or less.

2. The method according to claim 1, further comprising sulfuric acid.

3. The method according to claim 1, wherein the etching solution is an etching solution for use in manufacturing a semiconductor device.

4. A method of manufacturing a semiconductor device, the method comprising the method of treating a substrate according to claim 1.

5. A method of treating a substrate, the method comprising a step of bringing an etching solution into contact with a substrate comprising a silicon oxide film and a silicon carbonitride film, wherein the etching solution is composed of a solution comprising phosphoric acid, water, and an effective amount of a cerium compound excluding cerium dioxide such that a content of a tetravalent cerium ion contained in the etching solution is 0.001 mol/L or greater and 0.2 mol/L or less.

6. The method according to claim 5, wherein the cerium compound is selected from the group consisting of cerium hydroxide, cerium nitrate, cerium sulfate, cerium ammonium nitrate, and cerium ammonium sulfate.

7. The method according to claim 5, wherein the cerium compound is cerium ammonium nitrate.

\* \* \* \* \*